United States Patent [19]

Le Bihan

[11] Patent Number: 5,092,335

[45] Date of Patent: Mar. 3, 1992

[54] METHOD FOR THE IMAGING OF INTRA-VOXEL MOVEMENTS BY NMR IN A BODY

[75] Inventor: Denis Le Bihan, Nanterre, France

[73] Assignee: General Electric CGR SA, Paris, France

[21] Appl. No.: 256,563

[22] Filed: Oct. 12, 1988

[30] Foreign Application Priority Data

Oct. 13, 1987 [FR] France ............... 87 14098

[51] Int. Cl.⁵ .......................................... A61B 5/055
[52] U.S. Cl. ................... 128/653.2; 324/309
[58] Field of Search ............. 128/653, 653 A, 653 AF, 128/653 SC; 324/309, 312, 306

[56] References Cited

U.S. PATENT DOCUMENTS

| | | | |
|---|---|---|---|
| 4,609,872 | 9/1986 | O'Donnell | 324/306 |
| 4,694,253 | 9/1987 | LeRoux | 128/653 |
| 4,699,148 | 10/1987 | Gyngell | 128/653 |
| 4,716,367 | 12/1987 | Patz | 324/309 |
| 4,780,674 | 10/1988 | Breton et al. | 324/306 |
| 4,788,500 | 11/1988 | Patz et al. | 324/309 |
| 4,803,431 | 2/1989 | Saro et al. | 324/306 |
| 4,809,701 | 3/1989 | Le Bihan et al. | 128/653 |

FOREIGN PATENT DOCUMENTS 0216490  4/1987  European Pat. Off.

OTHER PUBLICATIONS

Magnetic Resonance Imaging, vol. 1, 1982, pp. 197–203; P. R. Moran, "A Flow Velocity Zeugmatographic Interlace for NMR Imaging in Humans".

Primary Examiner—Lee S. Cohen
Attorney, Agent, or Firm—Oblon, Spivak, McClelland, Maier & Neustadt

[57] ABSTRACT

Movements within volume elements or voxels of a body are depicted by subjecting this body to sequences of electro-magnetic excitation of the SSFP type during an NMR experiment. It is shown that by performing two series of excitation/reading sequences with different sensitization characteristics, it is possible to obtain images of molecular diffusion and/or perfusions in a far quicker and in a far more differentiated way than with standard types of excitation methods, of the spin-echo type for example.

2 Claims, 4 Drawing Sheets

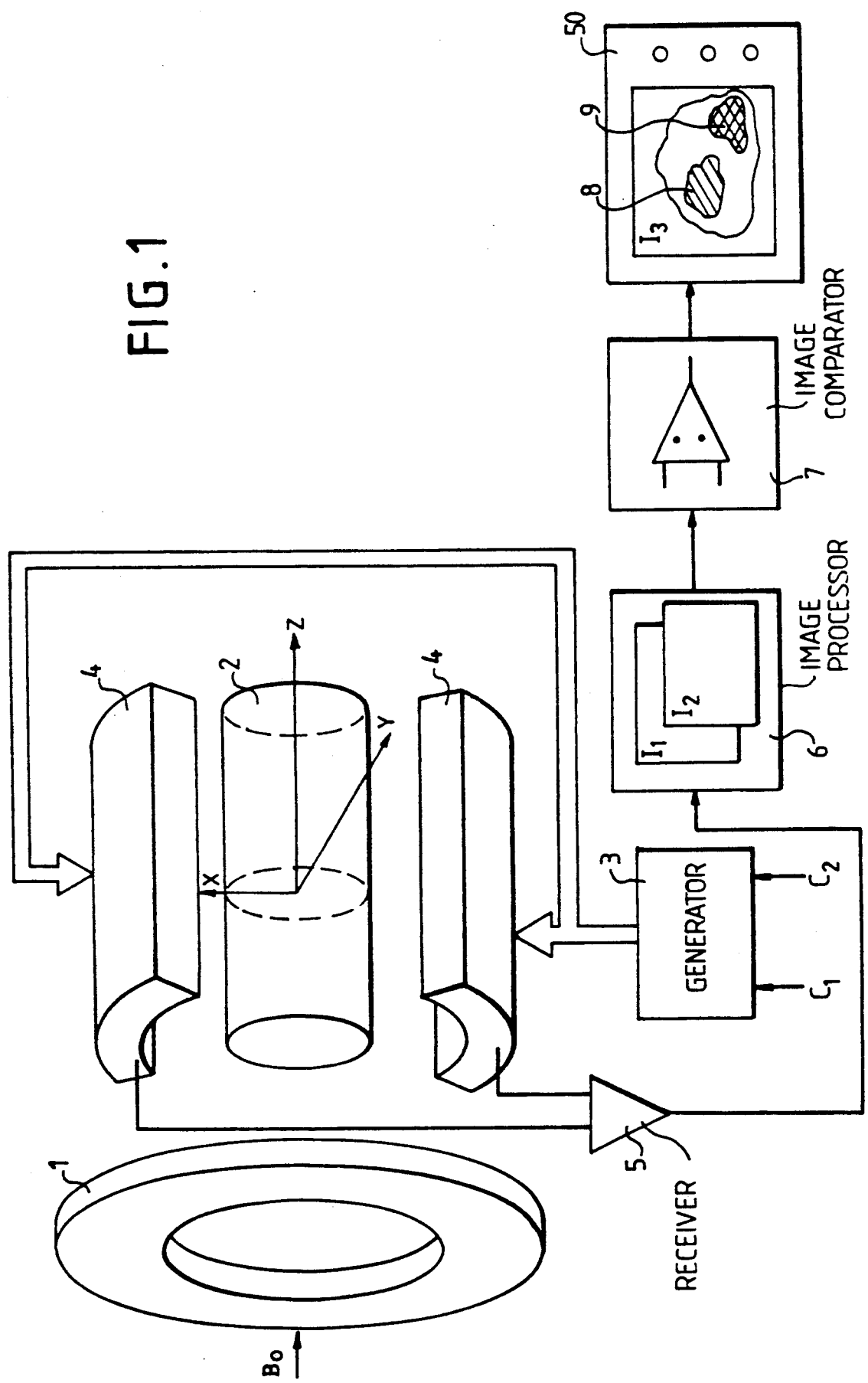

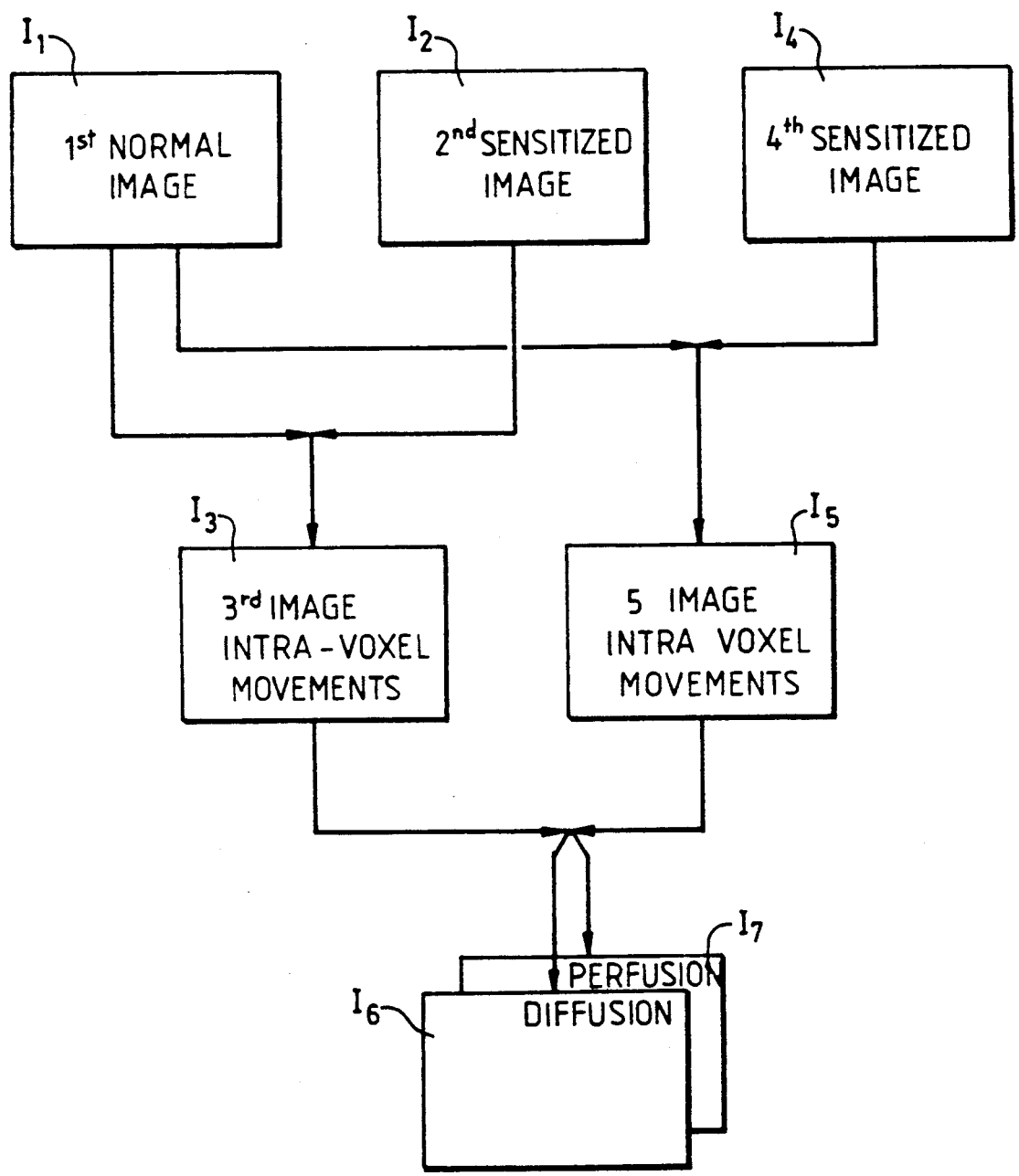

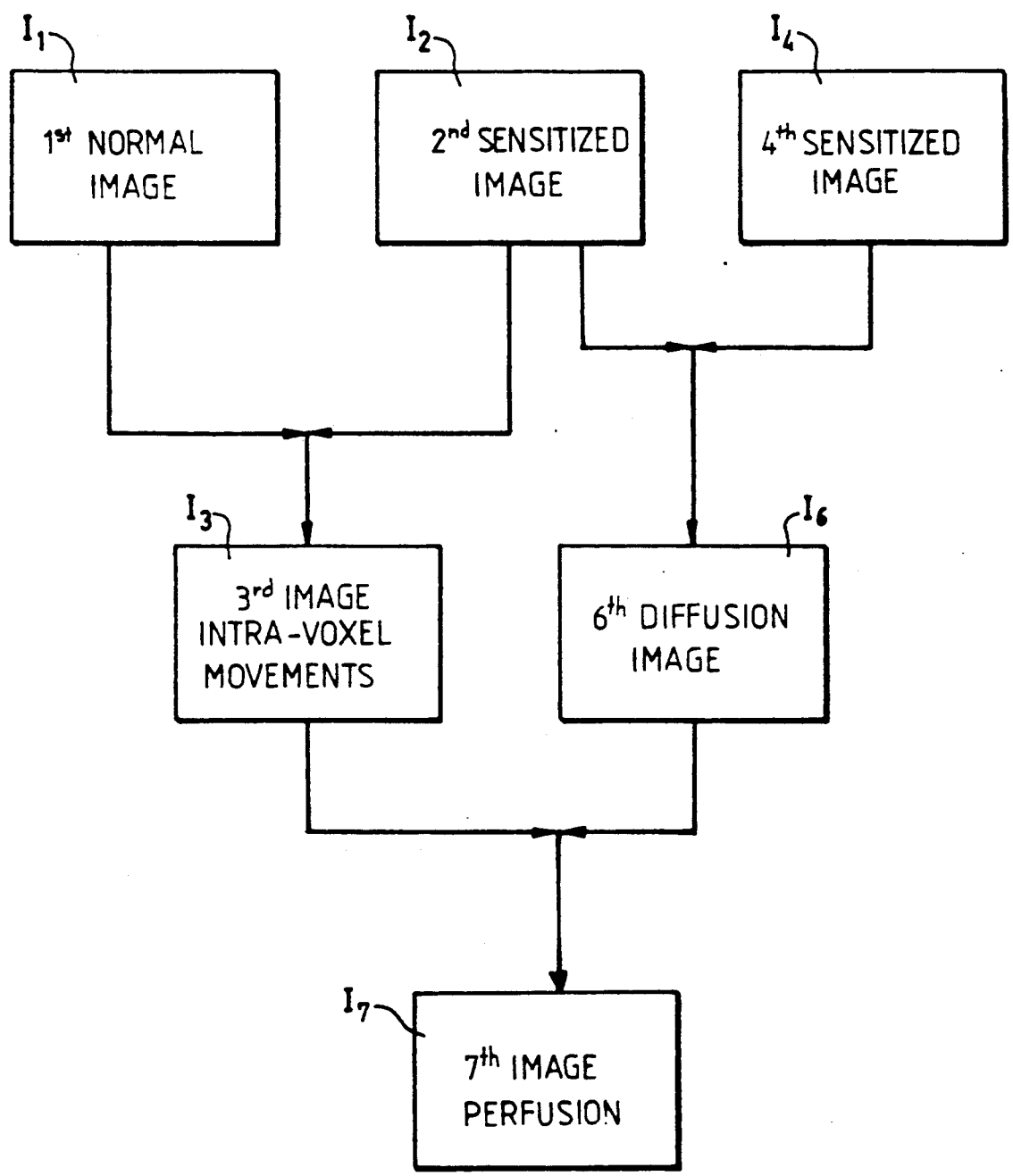

METHOD FOR THE IMAGING OF INTRA-VOXEL MOVEMENTS BY NMR IN A BODY

BACKGROUND OF THE INVENTION

1. Field of the Invention

An object of the present invention is a method for the imaging of intra-voxel movements by nuclear magnetic resonance (NMR) in a body. It can be applied more particularly in medicine where NMR imaging is an indispensable diagnostic tool.

2. Description of the Prior Art

A known method of NMR imaging is described in the European patent No. 86 401 423.8. In this method, it is explained that the depiction of standard images by highlighting the spin-lattice relaxation times $T_1$ and the spin-spin relaxation times $T_2$ of the magnetic moments of the particles of a body being examined is not always enough to differentiate certain healthy tissues from neighboring tumors and to identify lesions. For improved differentiation, it was proposed to measure and depict the distribution of the molecular diffusion coefficients of the imaged tissues. In the development and perfecting of this invention, it emerged that the method used to reveal the molecular diffusion coefficients did not circumvent the effect of the more comprehensive molecular movements within the volume elements taken into account, corresponding to the necessary discretization of an image to enable the computation of this image. These volume elements are called voxels. For, group movements such as movements of blood molecules create micro-circulation motions which become identified with the molecular diffusion characteristics of the tissues examined.

In the above-mentioned patent application, it was shown that, by repeating an imaging experiment with different experimental characteristics and by comparing the results obtained at the end of the first experiment with those obtained at the end of the second experiment, it was possible to depict two images. With these two images, it was possible to present the molecular diffusion coefficients independently of the coefficients of blood perfusion of the tissues and vice versa.

In practice, the first experiment comprises two series of radiofrequency excitations of the body under NMR examination: a first series known as a series with little diffusion and a second series known as a diffusive series. The second experiment has only a third series of radiofrequency excitations, also called diffusive but having characteristics of sensitization to molecular diffusion which are different from the characteristics of sensitization to the molecular diffusion of the second series of excitations. For, in the second experiment, it is unnecessary to reiterate the series of excitations with little diffusion. A series of radiofrequency excitations more precisely comprises a series of excitation/measurement sequences. In each sequence, the body to be examined is made to undergo an excitation, at the end of which the NMR signal resulting from this excitation is measured. During the excitation, magnetic encodings of space are additionally applied to the body so as to cause encodings of the measured signal in order to extract therefrom, by decoding, information directly representing luminosity values to be assigned to the different pixels of the image. These encoding/decoding operations constitute imaging methods. These encodings are applied in the form of magnetic field gradient pulses. A preferred imaging method described in the above-mentioned patent application is the 2DFT method. The essential feature of the invention which wa the object of the above-mentioned patent application resides in the fact that there is a common duration to all the sequences of every series of experimental sequences.

In the excitation-measuring sequences, the NMR signal resulting from the excitation is known to fade away very quickly after excitation, namely before the additional magnetic encodings can be efficiently applied to the regions to be imaged, prior to the measurement. This fading away is due to non-homogeneity in the orienting magnetic field in the body examined. This non-homogeneity causes a corresponding dispersal in the phase of the NMR signals emitted by the different particles distributed in space. It has become customary to cause this phase dispersal to be reflected by applying an additional excitation pulse, called a spin-echo pulse or, again, a 180° pulse because it causes the orientation of the magnetic moments of the particles to be imaged to flip by 180°. At the end of a period which is twice the interval between the initial excitation and the application of this 180° excitation pulse, the signal is revived and can be measured. Typically, each excitation-measurement sequence of this type is separated from the following one by 400 to 1000 milliseconds (repetition time).

The greater the number of excitation-measurement sequences of each series of excitations, the more precise is the definition of the images presented. Ultimately, the images determined at the end of each series are all the more precise if the time taken to acquire them is long. Since it is necessary to acquire three series of excitations, the total period during which a patient is subjected to an NMR excitation of this type may rule out this kind of examination. This approach entails examination periods of about 20 minutes. In general, to resolve problems related to the duration of the experiment, the excitation method currently used is the so-called SSFP (steady state free precession) method. In this method, the excitations are very close to one another in time and cause the magnetic moments of the nuclear particles of the body to flip each time by a relatively small angle depending on the period between the excitations.

It has been shown that this method, although it has no 180° spin-echo excitation pulse, causes the revival of composite NMR signals formed by echos of free precession signals. These revived signals can be used as measurable NMR signals. It has thus been shown that a state of dynamic equilibrium can be created between a longitudinal magnetization $M_z$ of the magnetic moments of the particles and the transversal magnetization $M_{xy}$ of these magnetic moments by choosing a radiofrequency pulse corresponding to a flip-over angle known as the angle of Ernst, the value of which depends on the repetitivity of the excitation pulses of the sequence and on the average spin-lattice relaxation time of the particles sought to be represented.

When no gradient pulse is applied, the phenomenon occurs simply. On the contrary, for imaging, space encoding pulses must be applied during each sequence in order to differentiate between the contributions of the different particles in the NMR signal. It has been shown that the dynamic equilibrium of the transversal magnetization $M_{xy}$ is got by re-phasing the transversal magnetization of the moment of each pulse. The re-phasing is got by reversing the direction of the gradient at the origin of the phase shift: by compensating, at the end of each sequence, for the phase shift effects due to the encoding gradients of the image. The reappearance of the NMR signal due to this re-phasing is called the "gradient echo". This notion of phase-shifting/rephasing concerns only the immobile particles placed at different positions in the magnetic field of the machine.

After a number of excitation pulses have been applied, it may be assumed that dynamic equilibrium has been set up. In this mode, a fall is observed in the NMR signal, after each pulse, as well as a rise in this signal, before each pulse. The fall (evanescent) may be considered to be the equivalent of a free precession signal of a standard sequence. The rise (echo) may also be considered to be the equivalent of a spin-echo signal. The NMR signal can be measured in advance of the measurement of this rising signal in the sequence. This can be got by applying additional gradient pulses which destroy the component of the NMR signal, related to the free precession signal, by phase-shifting. The effect of these additional gradient pulses, therefore, is firstly, to separate the reading signals according to their origin: namely, those coming from the free precession signal and those coming from the rising signal. They also have the effect, secondly, of advancing, in the excitation-reading sequence, the period during which the reading is done so that this reading of the NMR signal does not take place precisely when the excitation is applied.

In the invention, advantage has been taken of the existence of fast methods of the SSFP type to produce apparent molecular diffusion images or, by once again reiterating the series of excitations, true molecular diffusion and micro-circulation images. In principle, SSFP type methods are not indicated for these images because the sensitizing of the NMR signal to the molecular diffusion effect requires the application of strong diffusing gradient pulses, i.e. pulses with high amplitudes and long periods. Now, in an SSFP sequence, the period for which these pulses are applied is necessarily short since the sequence is itself short. The principle of the invention is based, nonetheless, on the reiteration of an SSFP sequence, with a diffusing gradient pulse force designed to remove the free precession component and to sensitize the sequence to diffusion and micro-circulation movements, which is different, in a second series of sequences, from a first series. By contrast, for the different series of sequences, the same excitation-reading characteristics are retained (in particular, the same repetition time) as also the same imaging characteristics (preferably, the depiction of comparable images is sought, with one and the same definition, hence with one and the same number of sequences in the series of sequences). It has been shown that there is an integration effect of these pulses of this diffusing gradient which then leads to a paradoxically high level of sensitivity.

SUMMARY OF THE INVENTION

Consequently, an object of the invention is a method for the imaging of intra-voxel movements by NMR in a body, comprising the following steps:
a) the body to be examined is subjected to an orienting magnetic field;
b) the body is subjected to a first series of SSFP type radiofrequency electro-magnetic excitation sequences in the presence of image encoding magnetic field gradients;
c) the magnetic resonance signal emitted in return by the body, at the end of each sequence of the first series, is measured and the characteristics of a so-called standard first image are extracted therefrom;
d) the body is subjected to a second series of SSFP type radiofrequency electro-magnetic sequences having the same characteristics as the sequences of the first series, in the presence of image encoding magnetic field gradients and in the presence of first, sensitizing magnetic field gradients,
e) the magnetic resonance signal emitted in return by the body at the end of each sequence of the second series is measured and the characteristics of a second image, called a sensitized image, are extracted therefrom;
f) the characteristics of the first normal image are compared with the characteristics of the second sensitized image and the characteristics of a third image corresponding to the intra-voxel movement in the body are deduced therefrom.

BRIEF DESCRIPTION OF THE DRAWINGS

The invention will be better understood from the following description and the appended figures. These figures are given purely by way of indication and in no way restrict the scope of the invention. Of these figures:

FIG. 1 shows a machine to implement the imaging method according to the invention;

FIG. 3 gives a schematic view of the organization of the experiments to be conducted to implement a preferred embodiment of the method of the invention.

FIG. 4 is a diagram of method steps according to the invention for showing perfusion phenomena in a patient's body.

DESCRIPTION OF PREFERRED EMBODIMENTS

Figure 2A:
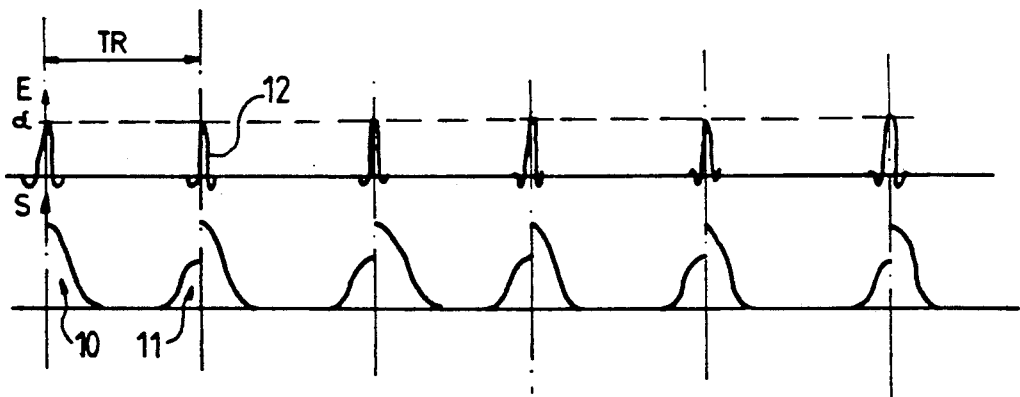
FIGS. 2a to 2c are timing diagrams of excitation signals, NMR signals and field gradient signals used in the method of the invention.
Figure 2B:
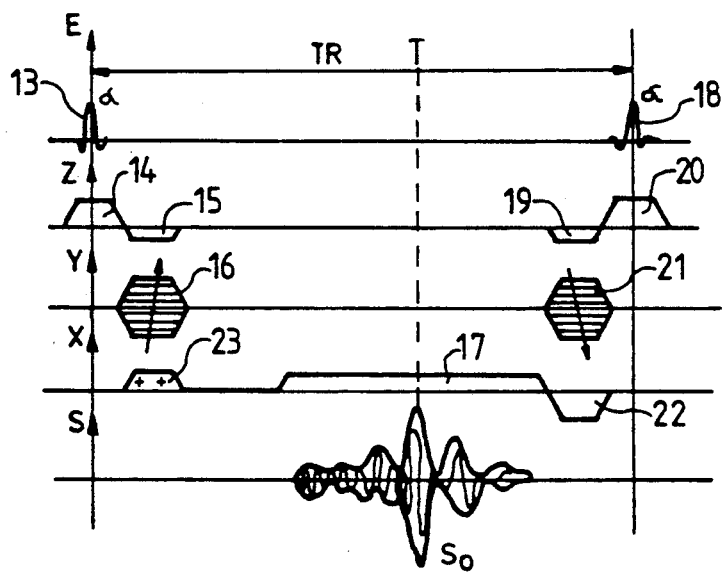
Figure 2C:
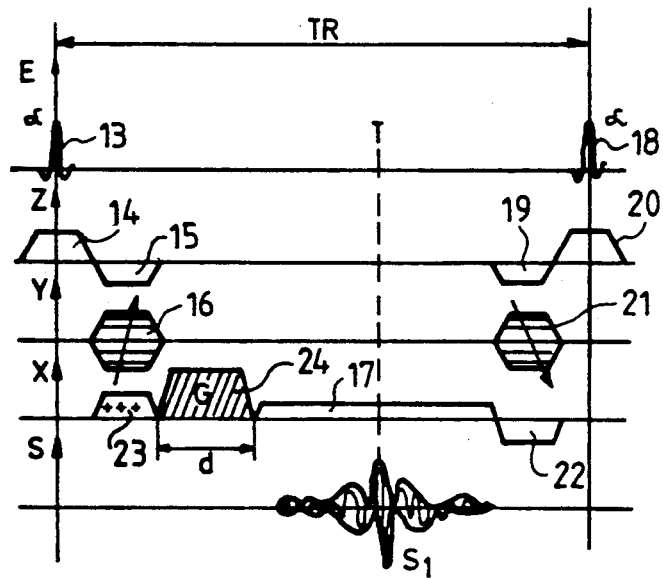

FIG. 1 shows an NMR machine to implement the method of the invention. This machine has means symbolized by a coil 1 to subject a body 2 to a high and constant magnetic field $B_O$. This device further has generators 3 and coils 4 to subject the body thus placed to excitation sequences of the SSFP type in the presence of field gradient sequences (FIG. 2b, 2c). The coils 4 represent the radiofrequency coils and the field gradient coils. The machine also has reception means 5 connected to the coils 4 to receive the magnetic resonance signal, and means 6 to compute and memorize a first normal image $I_1$ and a second sensitized image $I_2$ relating to two experiments put into effect by commands, marked $C_1$ and $C_2$, from the generating means 3. In processing circuits 7, the images $I_1$ and $I_2$ are compared dot by dot by computing the logarithm of the ratio of the values representing the magnetic resonance signals assigned to each picture element (pixel) of the images.

The processing circuit 7 then prepares a third image $I_3$, representing intra-voxel movements in which two regions 8 and 9 of the body 2, on an imaged section, have different responses in value of molecular diffusion and/or perfusion whereas they would have identical responses in standard magnetic resonance images. These images $I_1$ to $I_3$ can be displayed on a display device 50. The method for computing the images $I_1$ or $I_2$ is a standard one. In one example, the imaging method used by the means 6 is a 2D method, preferably a so-called 2DFT method. This 2DFT imaging method currently enables the obtaining of the best quality images. In one 2D imaging method, only one sectional plane is excited at a time by means of radiofrequency excitations applied in the presence of a so-called selection gradient. Thus, to simplify the explanation, in FIG. 1, the selection gradient may be oriented along the axis Z to select a cross-section (along a plane XY). The 2DFT (or 3DFT) imaging principle entails phase encoding of the different signals to be acquired. This is got by one (or more) pulses of a so-called phase-shifting gradient, the axis of which is perpendicular to a reading gradient with a constant direction. For example, for a cross section, the reading gradient could be the gradient X and the phase-shifting gradient could be the gradient Y. The image is reconstructed through a two-dimensional Fourier transform, whence the name of the method. Although the invention is described herein with a 2DFT type imaging method, it is nonetheless applicable to other imaging methods, especially methods of the 3DFT type which are deduced from the above method by generalization.

In the case of the invention, the radiofrequency excitations are of the SSFP type. They are shown in FIG. 2a. This figure shows a typical representation of the excitation pulses and signals corresponding to NMR in response to these excitations. In an SSFP type of method, the dynamic equilibrium of the longitudinal magnetization $M_Z$ and the transversal magnetization $M_{XY}$ was got for excitations E which cause the orientation of the magnetic moments of the particles in a body to flip by an angle $\alpha$ pre-determined by the spin-lattice relaxation time $T_1$ of the body's particles, on the one hand, and by the repetition time TR between different excitations on the other hand. If the angle $\alpha$ is accurately adjusted, the presence of two NMR signals S is noted, a first free precession signal 10 and a second so-called rising signal 11. In one sequence, the signal 11 is presented just before the application of an excitation pulse 12 of a following sequence. The signal 11 is weaker than the signal 10, firstly because of the combined effects of the non-homogeneity of the orienting field $B_O$ and, secondly, because of the effects of differences in precession speed due to chemical shift and to spin-spin relaxation ($T_2$).

FIGS. 2b and 2c show the special features of the method of the invention. In each sequence, with a period TR, of two series of sequences, an excitation 13 is applied in the presence of a pulse 14 of a slice select gradient. A selection pulse 14 is conventionally followed by a pulse 15 for the rephasing of the NMR signals related to a phase shift imposed by the duration of the pulse 14. Immediately after the selection of the section, a pulse 16 of a phase encoding gradient is applied therein with a value that varies from one sequence to another. For this reason, the phase encoding gradient 16 is shown with a slanted variation arrow. A pulse 17 of a read encoder gradient is applied at the instant when it is desired to pick up the NMR signal. After the reading, and so that a following excitation pulse 18 is applied to the particles under the same conditions, each of these pulses 14 to 17 is compensated for by gradient pulses, 19 to 22 respectively, on the same axes. If simple action were to be taken in this way, the rise 11 of the NMR signal and, therefore, its reading would have to be just before the application of the excitation 18. It is known that, by the application of a pulse 23 to the reading axis prior to the reading, it is possible, firstly, to cause the phase dispersal of the NMR signal connected to the free precession signal and, secondly, to advance the instant at which a rising signal S can be measured efficiently in the sequence to an instant T which can be used.

In the invention (FIG. 2c), the radiofrequency excitations and the measurements are repeated with the same characteristics in the course of a second series of sequences during which the efficiency of the dispersal pulse 23 is increased. For example, an additional gradient pulse 24 is imposed on the read axis with an amplitude G and a period d. If a standard computation (FIG. 3) is made of a first normal image $I_1$ at the end of the series of sequences of FIG. 2b, and if a computation is made, under the same conditions, of a second so-called sensitized image $I_2$ at the end of the sequences shown in FIG. 2c, by making a dot by dot comparison of the pixels of these images (in computing the logarithm of the ratio of luminosities assigned to each of these pixels) it is possible to deduce therefrom a third image $I_3$ representing intra-voxel movements. It is then discovered that this additional gradient pulse G.d, which has the effect of reducing the amplitude of the NMR signal $S_1$ in proportion to the movements inside the voxels, is, in this SSFP type sequence, far more efficient than an equivalent gradient pulse (G.d) applied in the previous spin-echo method. For, to obtain the same results, it is necessary in the prior art referred to, to choose far longer intervals d' of the diffusing gradients than those that can now be chosen. In practice, the spin-echo sequences, used in the prior art referred to, have repetition times (TR) of about 500 to 1000 milliseconds whereas the period TR of an SSFP type sequence is about 100 milliseconds at most. Whereas the diffusing, dispersive gradient pulses capable of being applied in sequences of this type ought to be ten times less efficient because of their duration, they are actually four times more efficient. In the invention, it has been realized, by maintaining the instants T at which the resulting NMR signals were read, that the efficiency of the pulses 24 was paradoxically far greater.

The far greater efficiency of the pulse 24, which in principle should be lower than that of the pulse that could be applied under the same conditions in a standard spin-echo sequence, is attributed to the phase shift integration undergone by the NMR signals of the magnetic moments of the particles, the echoes of which are caused by the sequence of excitations. In simplifying the explanation, it can be assumed that the signal S measured in an SSFP type sequence, is the composite result of the contributions of the number of echos of free precession signals. Thus, if particular instants of application of excitation are chosen (for example, so as to cause flipping, before each excitation, only in magnetic moments which have been brought, by their precession into phase opposition with respect to a coherent signal), it can be shown that, for the fixed particles in the body, the effect of the gradient pulse 24 like that of the pulse 23 is inverted every other time and, ultimately, only has compensated effects. On the contrary, for particles driven by movements in the body from one sequence to the next one, the compensation for the phase shifts does not occur. So much so that their contribution to the rising signal is dispersed: the greater the number of these particles driven by movements, the weaker the rising signal becomes.

In view of the fact that the SSFP type sequences deliver NMR signals with a signal-to-noise ratio smaller than that of signals from standard type sequences (because the measuring period is also smaller) and because the efficiency of the gradient pulse 24 located therein is increased tenfold, the computations of differentiation needed to arrive at the third image $I_3$, representing movements inside the volume elements, thus lead to far better results.

FIG. 3 shows a preferred mode of implementation of the invention. For, with a repetition time of about 100 milliseconds, each of the normal images $I_1$ and $I_2$ can be acquired in a period close to one minute. Knowing then that the patience of patients being examined in NMR machine is not excessively tried at this stage, a third series of sequences, also lasting about one minute, can be initiated by modifying the value of the gradient G and/or the period d of the additional gradient pulse 24. Let G' and d' be the conditions of acquisition of a fourth image $I_4$ which is also said to be sensitized and for which the other conditions of acquisition (imaging method) are, besides, identical to those of the images $I_1$ and $I_2$. The NMR signal received in this third series is called $S'_1$. By comparing, in the comparison circuit 7, the image $I_1$ with the image $I_4$ in the same way as the image $I_1$ was compared with the image $I_2$, it is possible to produce an other image $I_5$ of movements within voxels. In principle, this image can also be used to differentiate between two regions 8 and 9 of the body, on the imaged section, having different intra-voxel movement characteristics from each other. By then comparing the third image $I_3$ with the fifth image $I_5$ pixel by pixel, it is possible to compute a sixth image $I_6$ representing true characteristics of molecular diffusion inside each of the excited voxels and/or a seventh image $I_7$ representing the perfusion within the tissues studied. This second comparison may, as described in the above-mentioned prior art, amount to finding the solution to a system of two equations with two unknown quantities. For, it can be assumed that the two apparent coefficients of molecular diffusion, ADC and ADC' (obtained point by point respectively in each of the third and sixth images), can be written:

$$ADC = D + \{Log[((1-f)+fF_0)/((1-f)+fF_1)]\}/(b_1 - b_0)$$

$$ADC' = D + \{Log[((1-f)+fF_0)/((1-f)+fF'_1)]\}/(b'_1 - b_0)$$

In this expression D is the coefficient of true molecular diffusion inside a voxel in the body, f is the volume fraction of this voxel occupied by a fluid (blood) flowing in this voxel, $F_0$ and $F_1$ (or $F'_1$) are factors of attenuation due to the micro-circulation movements and relating to the non-diffusing and diffusing sequences respectively, wherein the signals $S_0$ (and $S_1$ or $S'_1$) are measured and wherein $b_0$ and $b_1$ (or $b'_1$) are factors depending on the gradient sequence used. In the above-mentioned patent application, an indication was given of how to compute these factors $F_0$, $F_1$ and $F'_1$. In particular, it was indicated that $F_0$ was substantially equal to 1 and had therefore had a negligible effect during the standard sequence: herein the sequences shown by FIG. 2b. And, in particular, if the gradients added to prepare $S_1$ and $S'_1$ are sufficiently efficient, $F_1$ and $F'_1$ may be considered to be substantially equal to zero. This notably simplifies the computations where the expressions of ADC and ADC' become:

$$ADC = D - (Log (1-f))/(b_1 - b_0)$$

$$ADC' = D - (Log (1-f))/(b'_1 - b_0)$$

These latter formulations of ADC and ADC' actually comprise two unknown quantities D and f. These two unknown quantities can be found by resolving the system of equations thus formed. D and Log (1−f) are sought. Then, knowing Log(1−f), f is found. The first image $I_3$ represents coefficients ADC, the second image $I_5$ represents coefficients ADC'. Knowing $b_1$ and $b'_1$ to be different for the computation of the images $I_2$ and $I_4$, this system can be resolved. In practice, three sequences are therefore needed to separate the true diffusion information D and the perfusion information f in each volume element. This comparison (the resolution of the equations system) can also be performed by comparison means 7 which, in a preferred way, comprise a standard processing unit.

Starting from the fact that, in the sensitized sequences, $F_1$ and $F'_1$, are 0, we can write:

$$D = \{Log (S_1/S'_1)\}/(b'_1 - b_1)$$

This enables the determination of the sixth image of pure diffusion by direct comparison of the second and fourth sensitized images. From the comparison of this sixth image, obtained directly, with the third image representing intra-voxel movements, it then becomes possible to determine the seventh pure perfusion image. FIG. 4 illustrates this process.

What is claimed is:

1. A method for the imaging of intra-voxel movements by NMR in a body, comprising the steps of:
   placing said body to be examined in a constant magnetic field of an NMR apparatus;
   subjecting said body to a first series of steady state free precession (SSFP) type radio frequency excitation sequences and the presence of phase encoding magnetic field gradients;
   measuring a magnetic resonance signal emitted by said body, at the end of each sequence of said first series, constructing a first image from said measured magnetic resonance imaging signal;
   subjecting said body to a series of SSFP type radio frequency excitation sequences having parameters which are the same as parameters of said first series, in the presence of encoding gradients and in the presence of first sensitizing magnetic field gradients which sensitize said body to intra-voxel movements;
   measuring a second magnetic resonance signal emitted by said body at the end of each sequence of said second series and constructing a second image from said second magnetic resonance signal; and
   calculating a third image from said first image and said second image, said third image depicting the intra-voxel movements of said body.

2. A method according to claim 1, comprising the further steps of:
   subjecting said body to a third series of SSFP type radio frequency sequences, in the presence of image encoding magnetic field gradients and the presence of second sensitizing magnetic field gradients;
   measuring a third magnetic resonance signal emitted by said body at the end of each sequence of said third series;
   constructing a fourth image from said third measured magnetic resonance signal;
   calculating a fifth image from said first image and said fourth image, said fifth image depicting intra-voxel movements of the body;
   calculating at least one of a sixth image and a seventh image from said third image and said fifth images, said sixth image depicting molecular diffusion and said seventh image depicting perfusion of a liquid in said body.

* * * * *